United States Patent
Shih

[11] Patent Number: 6,043,647
[45] Date of Patent: Mar. 28, 2000

[54] MAGNETIC ANOMALY DETECTOR FOR DETECTING THE MOVEMENT OF FERROUS METALS

[76] Inventor: Kelvin Shih, 908 Devonshire, Brighton, Mich. 48116

[21] Appl. No.: 08/796,610

[22] Filed: Feb. 7, 1997

Related U.S. Application Data

[60] Provisional application No. 60/030,781, Nov. 13, 1996.
[51] Int. Cl.[7] .................................................. G01R 33/02
[52] U.S. Cl. ........................... 324/244; 324/239; 340/551
[58] Field of Search .................................. 324/239–244, 324/253, 254, 255–258, 260, 225, 326–329; 327/510, 181, 187; 307/409; 33/355 R, 356; 340/547, 551, 552

[56] References Cited

U.S. PATENT DOCUMENTS

| | | | |
|---|---|---|---|
| 3,991,361 | 11/1976 | Mattern et al. | 324/244 |
| 4,323,848 | 4/1982 | Kuckes | 327/258 |
| 4,801,883 | 1/1989 | Muller et al. | 324/244 |
| 5,432,445 | 7/1995 | Dinsmore et al. | 324/253 |

*Primary Examiner*—Jay M. Patidar
*Attorney, Agent, or Firm*—Fildas & Outland, P.C.

[57] ABSTRACT

A magnetic anomaly detector for detecting the presence of ferrous metal objects such as firearms, knives, or other weapons. The detector contains a square wave generator, a sensor for sensing ferrous metal objects, a sensor amplifier, a main amplifier, and a display. When a ferrous metal object is detected by the sensor, the resultant anomaly in the magnetic field causes portions of a pulse train being input to the sensor amplifier extend past a preset threshold, causing an average input value of an integrator to change. The integrator then forces the average input value of the waveform to zero over an extended period of time to compensate for the changes in the magnetic field. The value at the integrator input represents the magnetic anomaly. The anomaly is also visually displayed in an LED bar graph display for easy detection of weapons by the operator.

16 Claims, 11 Drawing Sheets

$V_{out}$ will go up.

$V_{out}$ will go down.

MAGNETIC ANOMALY DETECTOR FOR DETECTING THE MOVEMENT OF FERROUS METALS

This application claims benefit of provisional application No. 60/030,781 filed Nov. 13, 1996.

TECHNICAL FIELD

The present invention relates to magnetic anomaly detectors for use in metal detectors, and more particularly to a magnetic anomaly detector that senses changes in the earth's magnetic field caused by movement of ferrous material near the detector.

BACKGROUND OF THE INVENTION

Many buildings use metal detectors to screen incoming visitors for weapons such as firearms or knives. These detectors are most commonly seen at airports, but the use of metal detectors in schools and courthouses is increasing due to rising concern about the possibility of violent crime in these institutions.

A common problem with conventional metal detectors is that they cannot distinguish between objects containing iron ("ferrous") and those that do not contain iron ("non-ferrous"). The vast majority of weapons are manufactured from ferrous metals, but since many metal detectors will detect non-ferrous metals as well as ferrous ones, the detectors will sound an alarm in the presence of many common metallic objects, such as keys, belt buckles and coins, in addition to weapons. Since most people entering a building would be carrying keys or coins, conventional metal detectors tend to sound an alarm for nearly every person walking through it, requiring security officers to either ask the person to remove the keys or coins from his or her pockets or use a separate metal detecting wand to pinpoint the location of the offending metal objects. Both alternatives tend to be time-consuming and somewhat of an inconvenience, particularly if there are many people waiting in line to pass through the metal detector.

Most metal detectors use a "beat frequency oscillator" ("BFO") detector. This type of detector has a search loop oscillator and reference oscillator. These two oscillators oscillate at the same frequency if there is no metal near detector. When a metallic object passes through the BFO detector, the search loop oscillator frequency changes in relation to the frequency of the reference oscillator. This causes the beat frequency between the search loop oscillator and the reference oscillator to increase, setting off an alarm. The main problem with the BFO detector is that it will detect metallic materials indiscriminately; it does not distinguish between ferrous metals (which are most commonly used in weapons) and other metallic substances, such as those used in coins and keys.

One possible method of distinguishing between ferrous and non-ferrous metals is by using a magnetometer, such as the one in U.S. Pat. No. 5,432,445 to Dinsmore et al, entitled "Mirror Image Differential Inductor Amplitude Magnetometer". Since only ferrous metals are magnetic, magnetometers can distinguish between ferrous and non-ferrous metals. The sensor shown in Dinsmore et al. requires an outside coil wrapped around a pair of closely matched coils for sensing the magnetic field. Each of the matched coils has a magnetically permeable strip in its center. The matched coils must be identical and the magnetic characteristics of the center strips must also be identical, or a "mirror image" of each other. Manufacturing the center strips is particularly cumbersome and expensive; since each of the strips is punched from a single sheet of metal, the mechanical stresses from the punching process changes the magnetic characteristics of every strip. The strips must then be heat-treated through a hydrogen annealing method in an attempt to bring the strips' magnetic properties back to their original state. However, it is impossible to bring the magnetic properties of each individual strip to exactly the same state as before the punching process or to match the magnetic properties between strips. Since the matched coils and center strips must be "mirror images" of each other, any mismatch in the characteristics between the coils and between the strips, no matter how slight, will render the sensor, and thus magnetometer, useless. In initial batches of sensors tested by the inventor, only about half of the finished sensors were usable.

In addition, the circuitry in the Dinsmore et al. magnetometer required an extremely pure sine wave input to drive the sensor. Generating a pure stable sine wave input without any changes in its frequency or amplitude is difficult and unduly complicates the circuitry within the magnetometer. The sensor generates two outputs, requiring many manipulations of the two outputs in the signal conditioning in the Dinsmore et al. magnetometer to generate a voltage which is proportional to the magnetic field sensed by the sensor, thus further complicating the circuitry. This circuit could also be used to detect minute changes in the earth's magnetic field, as opposed to the absolute value of the earth's magnetic field, but additional complicated circuitry is needed and a large output voltage is needed to make the device more sensitive. However, increasing the output voltage in a DC magnetometer often saturates the circuit if the field is too strong, making detection of any changes in the magnetic field impossible since the value of the output voltage is too close to the value of the power supply.

OBJECTS AND ADVANTAGES

Accordingly, it is an object of the invention to create a magnetic anomaly detector which can measure minute changes in the earth's magnetic field while ignoring DC changes unrelated to the movement of ferrous materials, such as .the orientation of the sensor, steel beams in the building, or nearby steel furniture.

It is another object of the invention to provide a magnetometer having a sensor which does not require any mirror imaging of any of its internal parts.

Further objects and advantages will become apparent from a consideration of the following description and accompanying drawings.

DETAILED DESCRIPTION OF THE PREFERRED EMBODIMENT

Figure 1:
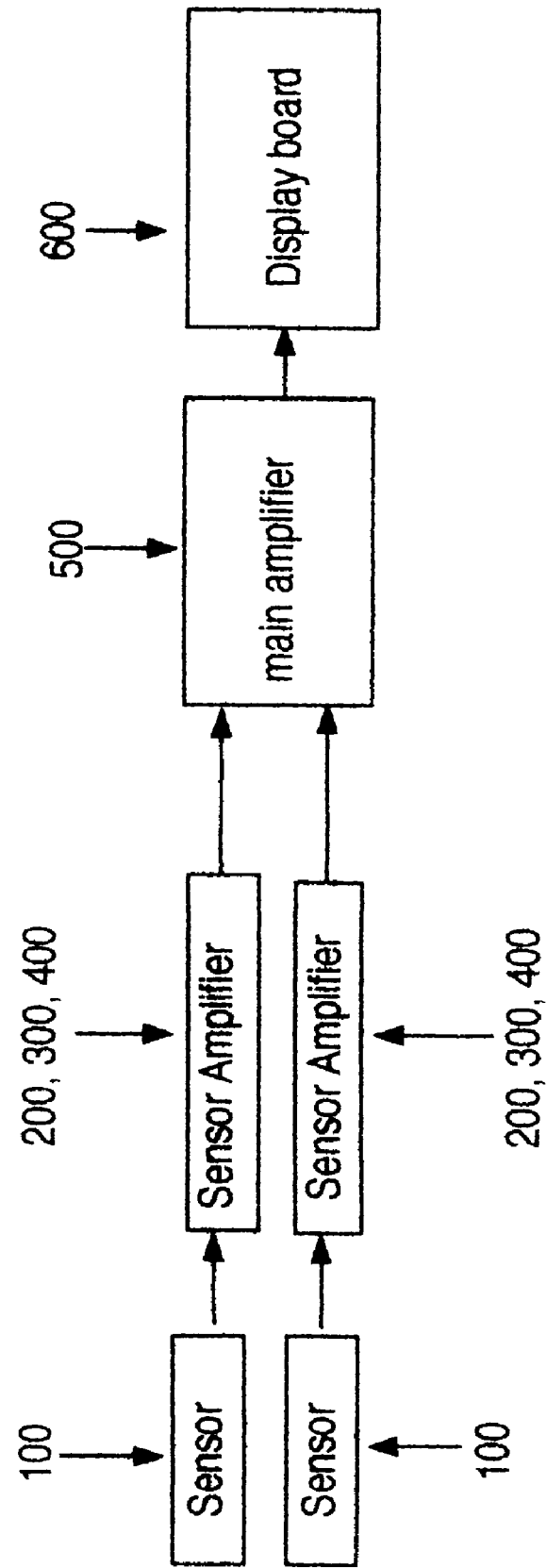
FIG. 1 is a block diagram of the magnetic anomaly detector of the present invention.

FIG. 1 illustrates the basic components of the magnetic anomaly detector. FIG. 1 shows two sensors 100, each connected to a sensor amplifier 200, 300 or 400. The outputs of the respective sensor amplifiers 200, 300 or 400 are fed to a main amplifier 500. The sensor amplifier 200, 300 or 400 not only provides a drive signal to the sensor 100, but also signal conditions the output from the sensor 100 so that a small change in the magnetic field strength detected by the sensor 100 results in a large, easily discernible change in the output voltage of the sensor amplifier 200, 300 or 400. The main amplifier 500 first amplifies and fullwave rectifies the two inputs, then sums them in a summing amplifier. The summing amplifier stage in the main amplifier 500 provides a sensitivity adjustment and an adjustable voltage reference to eliminate the effects of variations in the earth's magnetic field itself on the output result. The last stage in the main amplifier 500 is a peak detector with bleed resistor. This peak detector enables LED's in a display 600 to stay on longer so they can be read easily. The display 600 converts a voltage to a 10 LED bar graph display and includes a buzzer with an adjustment means so that when the bar graph LED's reach a predetermined value, the buzzer will activate.

Figure 2:
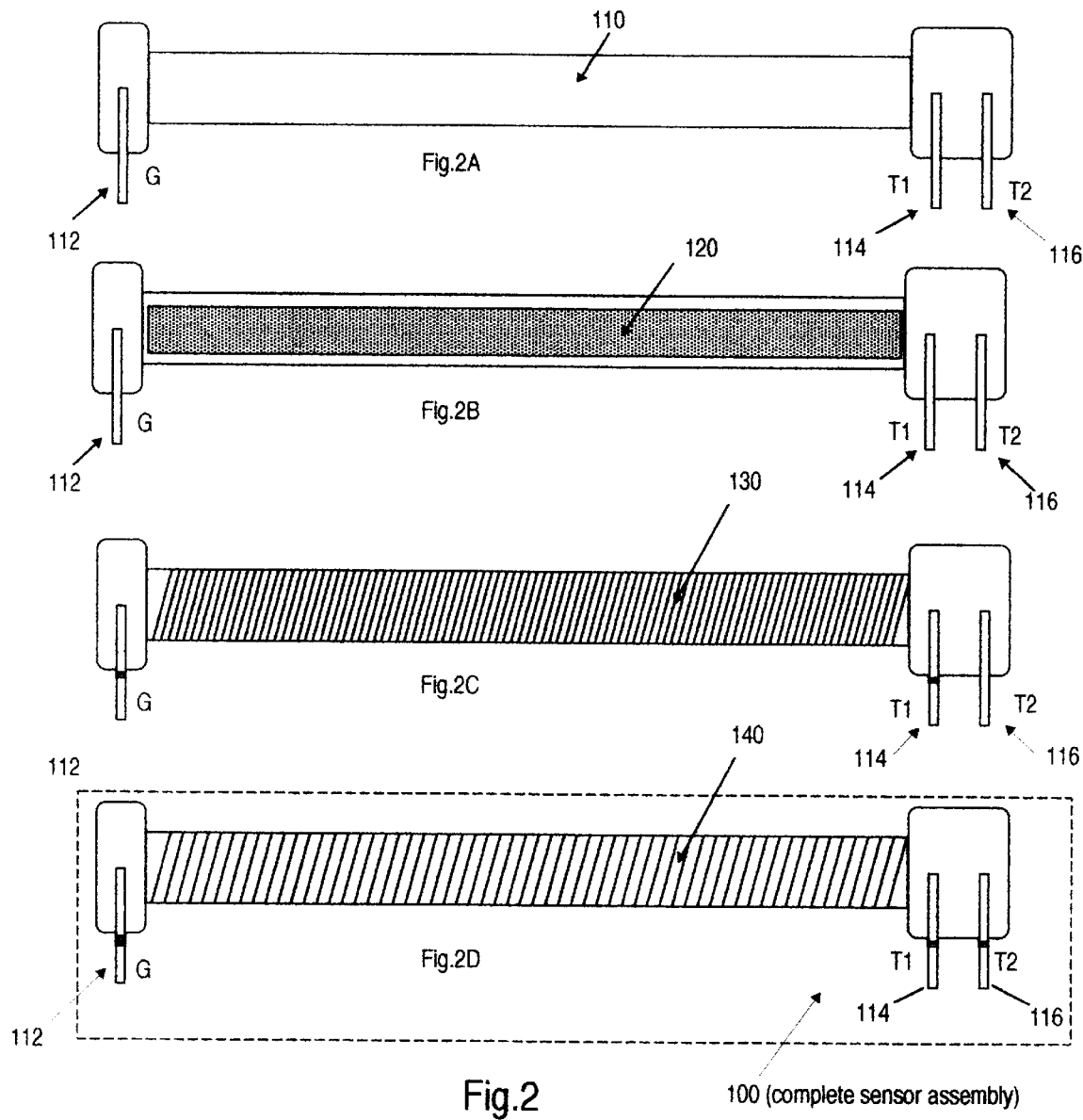
FIGS. 2A through 2D are diagrams of a sensor in the magnetic anomaly detector.

FIGS. 2A through 2D illustrate how the sensor 100 is constructed. Referring to FIG. 2A, the sensor 100 contains a plastic bobbin 110 having three copper leads 112, 114 and 116 attached to it. The leads are preferably made of non-ferrous metal so that the leads will not distort the magnetic field near the sensor. FIG. 2B shows a high permeability thin metal alloy strip 120 attached to the bobbin on one side with an adhesive. This metal strip 120 is made of highly permeable material such as MU metal, Advanced Magnetic AD-90 by Advanced Magnetic Corporation. The cross sectional area of this strip must be very small so that saturation can easily occur when the sensor 100 is driven by an external coil. The metal strip 120 can not be cut mechanically because the thickness of the metal is very thin. If metal strips are cut by mechanical means, the magnetic properties of the strip will be lost. Although hydrogen annealing can partially recover the magnetic properties of the strip, it still will not return the magnetic properties of the metal to its original state.

Instead of mechanical cutting, the metal strips 120 of the present invention are preferably cut from a large virgin material sheet by a chemical etching method. First, both sides of the thin high permeability metal sheet are covered with photoresist and dried in an oven. Next, two identical photo positive films having an image of many strips is used to sensitize the metal sheet. After the metal sheet is sensitized, the leftover photoresist is removed and the entire sheet is cleaned. The sheet is then dipped into acid for etching. Since the dividing lines between the strips were exposed and the strips were protected in the sensitizing process, all the strips will be separated from each other after the etching process. Each sheet can yield hundreds of metal strips 120 without destroying the magnetic properties of the virgin material since the sheet undergoes no mechanical stresses.

Referring to FIG. 2C, a winding 130 is wound on top of the combination of the bobbin 110 and the magnetic strip 120. This winding will terminate at terminal 112 and terminal 114. A second winding 140 is wound on top of the first winding 130, as shown in FIG. 2D. This second winding 140 will terminate at one end at terminal 112 and the other end at terminal 116. After this step, a layer of protective coating is applied to protect the windings 130 and 140. The completed sensor assembly forms sensor 100.

Figure 3:
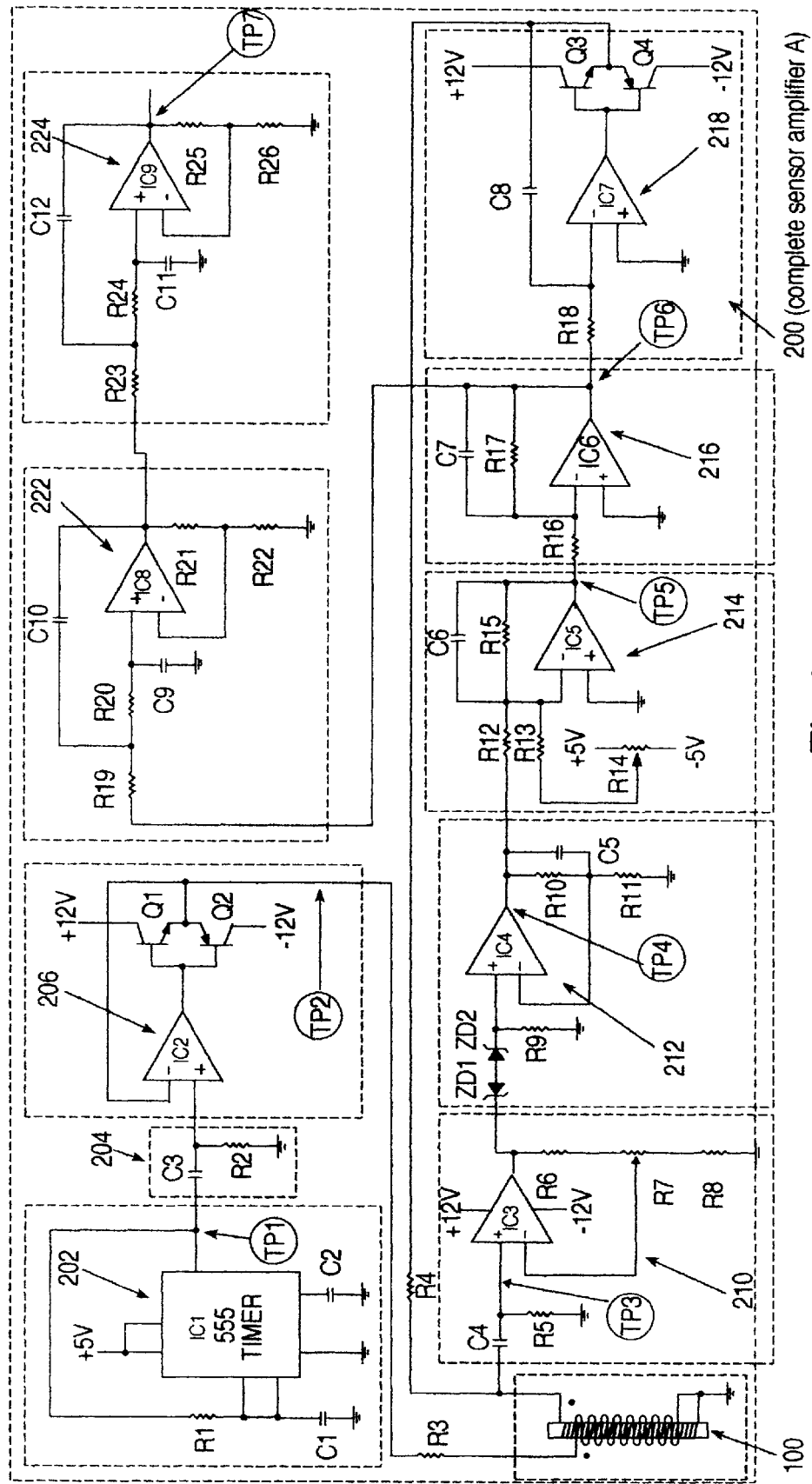
FIG. 3 is a schematic of one embodiment of a sensor amplifier in the magnetic anomaly detector.
Figure 4A:
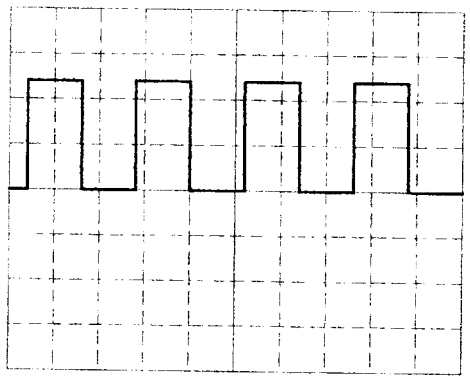
FIGS. 4A through 4G are waveforms taken at various test points in the sensor amplifier of FIG. 3.

FIG. 3 shows one embodiment of sensor amplifier 200. Sensor amplifier 200 converts minute changes in magnetic flux disturbance caused by the movement of ferromagnetic metal near sensor 100 into large voltage changes at the output of the sensor amplifier 200. A square oscillator 202 contains a 555 timer IC1, resistor R1 and capacitor C1, which are connected together to generate a near 50% duty cycle square wave. The output amplitude of the oscillator 202 in this example is 0 to 5 volts, as illustrated in FIGS. 4A at test point 1.

A DC de-coupling stage 204 contains a blocking capacitor C3 and resistor R2. The DC decoupling stage 204 is used to block out the DC voltage in the waveform output from the oscillator 202 and prevent it from reaching the next amplifier stage. The output of DC decoupling stage 204 in this example is a square wave having a magnitude between –2.5 V and +2.5 V.

Figure 4C:
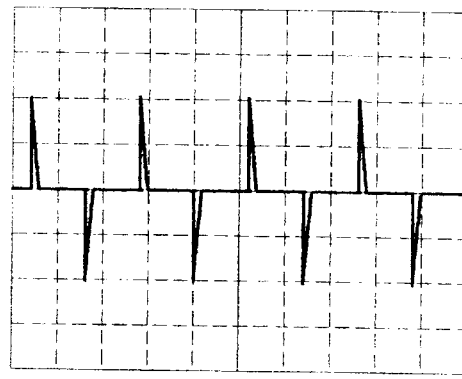
Figure 4B:
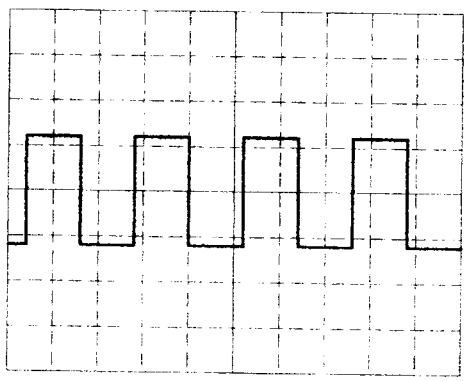

A driver stage 206 connected to the DC decoupling stage 204 has an operational amplifier IC2 and a pair of complementary transistors Q1 and Q2. The driver stage 206 is connected as a unity gain buffer and provides the current needed to drive the sensor 100. Refer to FIG. 4B, which shows the output waveform of the driver stage 206. A resistor 208 is used to limit the current flowing to sensor 100.

An adjustable gain amplifier 210 connected to the sensor 100 contains an operational amplifier IC3, resistors R5, R6, R8, potentiometer R7, and capacitor C4. The adjustable gain amplifier 210 amplifies the output of the sensor 100. Capacitor C4 and resistor R5 are used to separate the AC signal from DC feedback that shared the same winding of sensor 100. FIG. 4C shows the pulse train at the input of the amplifier 210. Operational amplifier IC3 in the adjustable gain amplifier 210, along with resistors R6, R8 and potentiometer R7, are connected together as a non-inverting amplifier with gain adjustment capability.

Figure 4D:
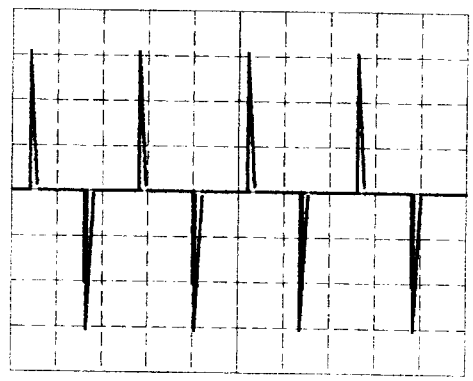

Selective amplifier 212 contains Zener diodes ZD1, ZD2 resistors R9, R10, R11, operational amplifier IC4 and capacitor C5. The selective amplifier 212 amplifies only the portion of the pulse train which is either larger than Vr or smaller than –Vr; in other words, the selective amplifier only amplifies the extreme tips of the pulse train outside of the –Vr/Vr range. Vr is the sum of the breakdown voltage plus the forward drop of the Zener diode ZD1 or ZD2. For example, if the Zener diodes used in the selective amplifier 212 is a 1N751, it will have a breakdown voltage of 5.1 V and a forward drop at low current levels of approximately 0.3 V. Thus, the selective amplifier 212 in this example will amplify only the part of the pulse train which is higher than 5.4 V or lower than –5.4 V. If the pulse train does not extend outside of the –5.4 V/5.4 V range, the output of the selective amplifier 212 will stay at zero level. Resistors R10 and R11 are used to set the gain of the non-inverting amplifier in the selective amplifier 212 and capacitor C5 sets the bandwidth and provides low pass filtering and pulse stretching. FIG. 4D shows the output waveform of the selective amplifier 212.

Next, an inverting summing amplifier 214 contains operational amplifier IC5, resistors R12, R13, R15, capacitor C6 and potentiometer R14. The inverting summing amplifier 214 provides additional gain and filtering to the system.

Figure 4E:
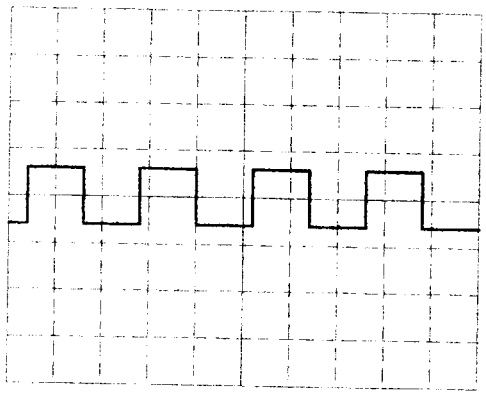

Also, the potentiometer R14 and resistor R13 compensates for the mismatch of the breakdown voltages between the two Zener diodes ZD1 and ZD2 in the selective amplifier 212 and zeroes out all of the offset voltages in the operational amplifiers in the system. FIG. 4E illustrates the output waveform of the inverting summing amplifier 214. Because of the filtering effect of capacitor C6, the waveform at the output of the inverting summing amplifier 214 will become a square wave instead of a pulse train.

Figure 4G:
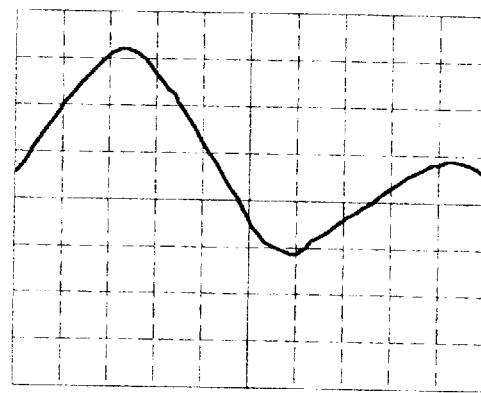
Figure 4F:
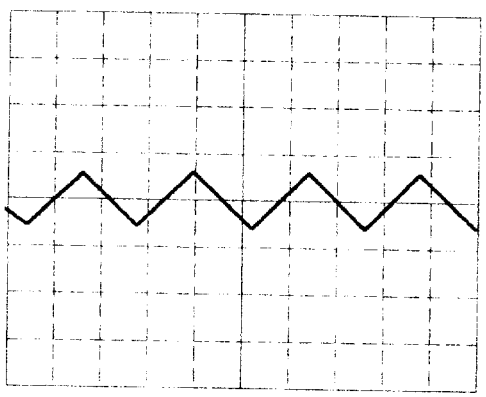

An additional inverting amplifier and filter 216 is used to provide additional gain and phase inversion to the system so that the polarity of the waveform will be such that the feedback from integrator 218 will cancel out the changes in the flux of the sensor 100. This amplifier stage contains operational amplifier IC6, resistors R16, R17 and capacitor C7. Because of the capacitor C7, the output of this inverting amplifier 216 will be a triangle wave instead of a square wave. FIG. 4F shows the output waveform of the inverting amplifier 216.

The integrator with buffer 218 is used to force the input of this stage to a DC zero. The integrator 218 contains resistor R18, capacitor C8, operational amplifier IC7 and a pair of complementary transistors Q3 and Q4. The time constant of this integrator equals R18*C8. This time constant is intentionally set very long so that the time it takes to force the input of the integrator 218 to a DC zero is longer than the time period over which changes in the input occur, about several hundred milliseconds. In other words, the long time constant allows the input of the integrator 218 to "float" temporarily as it is being forced to zero. Complementary transistor pair Q3 and Q4 is used to provide the current needed to counteract the earth's magnetic field and other existing permanent magnetic fields that are seen in the high permeability core material in the sensor 100. Resistor R4 is used to convert the voltage output of the integrator 218 into the current needed for cancelling out all of the magnetic flux in the core. If the input to the integrator 218 is positive, the output of the integrator 218 will start going lower and reduce or even change the direction of the current flowing into the secondary coil of sensor 100. This change will force the input of the integrator 218 to approach a DC zero. If the input to the integrator 218 is negative, the output of the integrator 218 will start going higher and increase or even change the direction of the current flow into the secondary coil of sensor 100. Again, this change will force the input of the integrator 218 to approach zero. Thus, the long term DC average voltage at the input of the integrator 218 will be zero even though the short term changes at the input will not be zero. These short term changes represent the anomalies in the magnetic field.

Low pass filter 222 contains operational amplifier IC8, resistors R19 through R22, and capacitors C9, C10. The filter is a preferably a two pole Sallen-Key equal value low pass filter. In the pass band of the low pass filter 222, the gain is 4.5 db, and in the stop band the attenuation is −40 db per decade. Since the input to the low pass filter 222 is the same as the input to the integrator, the long term average input value to the low pass filter 222 is zero, and the short term value, which represents the magnetic anomaly, is not zero. This filter 222 is used to clean up the signal received from the output of operational amplifier IC6 of inverting amplifier 216.

An additional low pass filter 224 is used to further clean up the signal output from low pass filter 222. The low pass filter 224 contains operational amplifier IC9, resistors R23 through R26, and capacitors C11, C12. Like C10 the previous low pass filter 222, this filter 224 is preferably a two pole Sallen-Key equal value low pass filter. In the pass band of the filter 224, the gain is 4.5 db and in the stop band the attenuation is −40 db per decade. This filter's cutoff frequency is set to be the same as the previous low pass filter 222. The output of operation amplifier IC9 in the low pass filter 224 is also the output of the sensor amplifier 200. FIG. 4G shows an output waveform of the sensor amplifier 200 when a ferrous metal object is moved near the sensor 100.

When there is no ferrous metal moving near the sensor 100, the whole sensor amplifier 200 will reach equilibrium. Any magnetic motive force impressed on the sensor 100 will be cancelled out by a counteracting magnetic motive force generated by the current flow through resistor 226 and the secondary coil of the sensor 100. Thus, the net magnetic flux flowing through the high permeability core in the sensor 100 will be zero. This equilibrium condition will be maintained regardless of the orientation of the sensor or the presence of nearby stationary ferrous objects because of the closed loop in the magnetic anomaly detector. However, when a ferrous object is moved quickly near the sensor 100, the sudden change in the magnetic field will cause a momentary change at the input of integrator 218 (see FIG. 4F) until the integrator 218 has time to correct the change and bring the circuit back to equilibrium.

For example, assume there is a increase of flux in the core of the sensor 100, resulting in an increase in the positive pulse height and a decrease in the negative pulse height of the pulse train input of the adjustable gain amplifier 210. After amplifier stages 210, 212, 214 and 216 there will be a positive DC voltage with a triangle wave at the output of inverting amplifier 216. This positive voltage will force the output of the integrator 218 to go down. This downward movement of the integrator output voltage will reduce the current flow through resistor 226 and the secondary coil of the sensor 100, counteracting the sudden change in the magnetic field and forcing the flux in the core of the sensor 100 to become zero. Because of the long time constant used in the integrator 218, the output of amplifier 216 is allowed momentarily to change freely. It is this momentary change at the output of amplifier 216 that gives the output signal of the sensor amplifier 200.

If there is a decrease of flux in the core of the sensor 100, this change will result in a decrease of positive pulse height and an increase of negative pulse height of the pulse train input of the adjustable gain amplifier 210. After amplifier stages 210, 212, 214 and 216, there will be a negative DC voltage with the triangle wave at the output of amplifier 216. This negative voltage will force the output of the integrator 218 to go up. This upward movement of the integrator output voltage will increase the current flow through resistor 226 and the secondary coil of the sensor 100, counteracting the sudden change in the magnetic field and forcing the flux in the sensor core to become zero. Because of the long time constant used in the integrator 218, the output of amplifier 216 is allowed momentarily to change freely. Again, this momentary change at the output of amplifier 216 gives the output signal of the sensor amplifier 200.

Arguably, the output of integrator 218 with AC coupled output and very small time constant could also be used as the output representing the magnetic anomaly. However, in order to increase the sensitivity of the magnetic anomaly detector, the resistance of feedback resistor R4 needs to be high, and at large ambient magnetic motive forces the output of the integrator simply runs out of room to change at all. One advantage of the present invention's design is that the freedom of movement of the input signal of the integrator 218 does not depend upon resistance value of R4, but instead depends upon the time constant R18*C8. Thus, further amplification and filtering of the integrator input signal becomes much easier.

Figure 8:
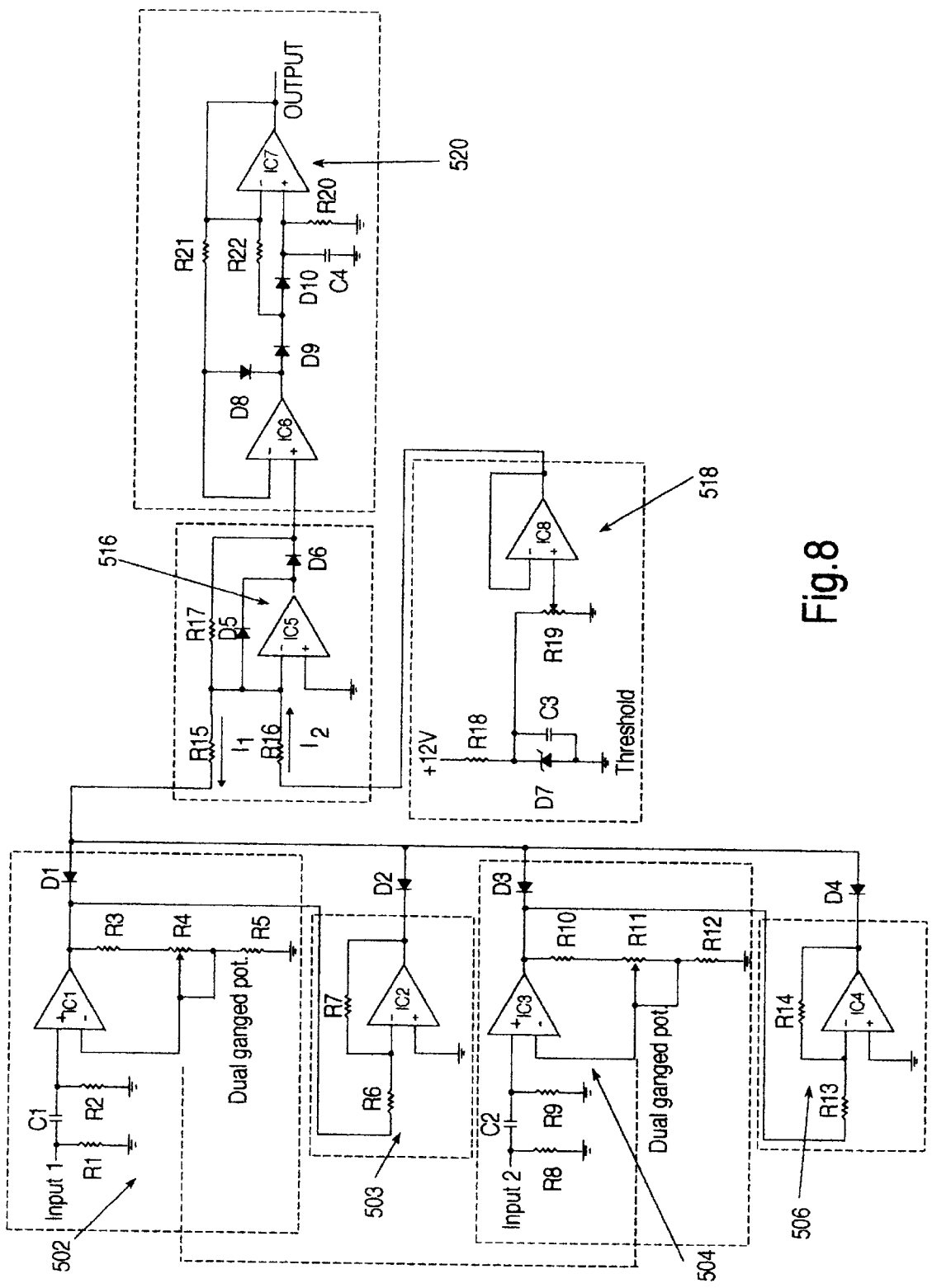
FIG. 8 is a schematic of a main amplifier in the magnetic anomaly detector.

Referring to FIG. 8, the main amplifier 500 is used to further signal process signals from the sensor amplifier 200 and add a sensitivity and threshold adjustment before feeding the signal into display stage 600.

Adjustable gain amplifier 502 contains operational amplifier IC1, resistors R1, R2, R3 and R5, capacitor C1 and a potentiometer R4 connected as a variable resistor. Capacitor C1 and resistors R1, R2 block out all the DC voltage so only AC changes can pass through the circuit. Operational amplifier IC1, along with resistors R3, R4, and R5, are connected as a non-inverting amplifier with a gain adjustment set by potentiometer R4. Inverting amplifier 503 contains operational amplifier IC2 and resistors R6, R7. During normal conditions, R6=R7, so the gain of the inverting amplifier 503 is −1.

If input 1 of the main amplifier 500 is positive, the adjustable gain amplifier 502 produces a positive signal at the output of operational amplifier IC1 and a negative signal of equal amplitude at the output of operational amplifier IC3. In this case, diode D2 will conduct current and diode D1 will be reverse biased. Conversely, if input 1 of the main amplifier 500 is negative, the adjustable gain amplifier 502 produces a negative signal at the output of operational amplifier IC1 and an positive signal of equal amplitude signal at the output of operational amplifier IC3. In this case, diode D1 will conduct current and diode D2 will be reverse biased. The voltage signal thus produced is then converted to a current signal through R15.

Similarly, adjustable gain amplifier 504 contains operational amplifier IC3, resistors R8, R9, R10, R12, capacitor C2 and potentiometer R11 are connected as a variable resistor. The capacitor C2 and resistors R8, R9 block out all of the DC voltage in input 2 so only the AC changes can pass through the circuit. Operational amplifiers IC3, along with R10, R11, R12, are connected as a non-inverting amplifier with gain adjustment set by potentiometer R11. Inverting amplifier 506 contains operational amplifier IC4 and resistors R13, R14. During normal conditions, R13=R14, so the gain of inverting amplifier 506 stage is −1.

If input 2 of the main amplifier 500 is positive, the adjustable gain amplifier 504 produces a positive signal at the output of operational amplifier IC3 and a negative signal of equal amplitude at the output of operational amplifier IC4. In this case, diode D4 will conduct current and diode D3 will be reverse biased. Conversely, if the input 2 is negative, adjustable gain amplifier 504 produces a negative signal at the output of operational amplifier IC3 and a positive signal of equal amplitude at the output of operational amplifier IC4. In this case diode D3 will conduct current and diode D4 will be reverse biased. The voltage signal thus produced is then converted to a current signal through resistor R15.

Adjustable reference 518 has Zener diode D7, resistor R18, capacitor C3, potentiometer R19 and operational amplifier IC8. This stage is used to set a threshold voltage for cancelling out the effects of the natural variations occurring in the earth's magnetic field. The output of adjustable reference 518 is fed to resistor R18.

Precision diode stage 516 contains operational amplifier IC5, resistors R15, R16, R17 and diodes D5, D6. When the sensor amplifiers 200 do not detect any variations in the magnetic field caused by the movement of ferrous metal, the changes occurring at input 1 and input 2 will be extremely small. Let us assume for this example that a small ambient magnetic noise will cause a current flow of I1. If the potentiometer R19 is adjusted so that current I2 is equal to or slightly larger than I1, then the output of this stage will be zero. When there is a sudden large change in the magnetic field, i.e., due to the movement of ferrous metal, both inputs will fluctuate wildly and current I1 will be larger than I2, causing a signal to appear at the output of the precision diode stage 516. The resulting output voltage equals (I1−I2)*R17.

Peak detector stage 520 contains operational amplifiers IC6, IC7, resistors R20, R21, R22, capacitor C4 and diodes D8, D9, D10. The peak detector stage 520 can be any conventional peak detector circuit. The purpose of the peak detector 520 is to hold the peak value of the rectified signal to make the LED display easier to read; otherwise, the LED display would change too quickly to be read easily. Capacitor C4 is a holding capacitor and resistor R20 is a large value resistor for bleeding the storage charge in the capacitor.

Figure 9:
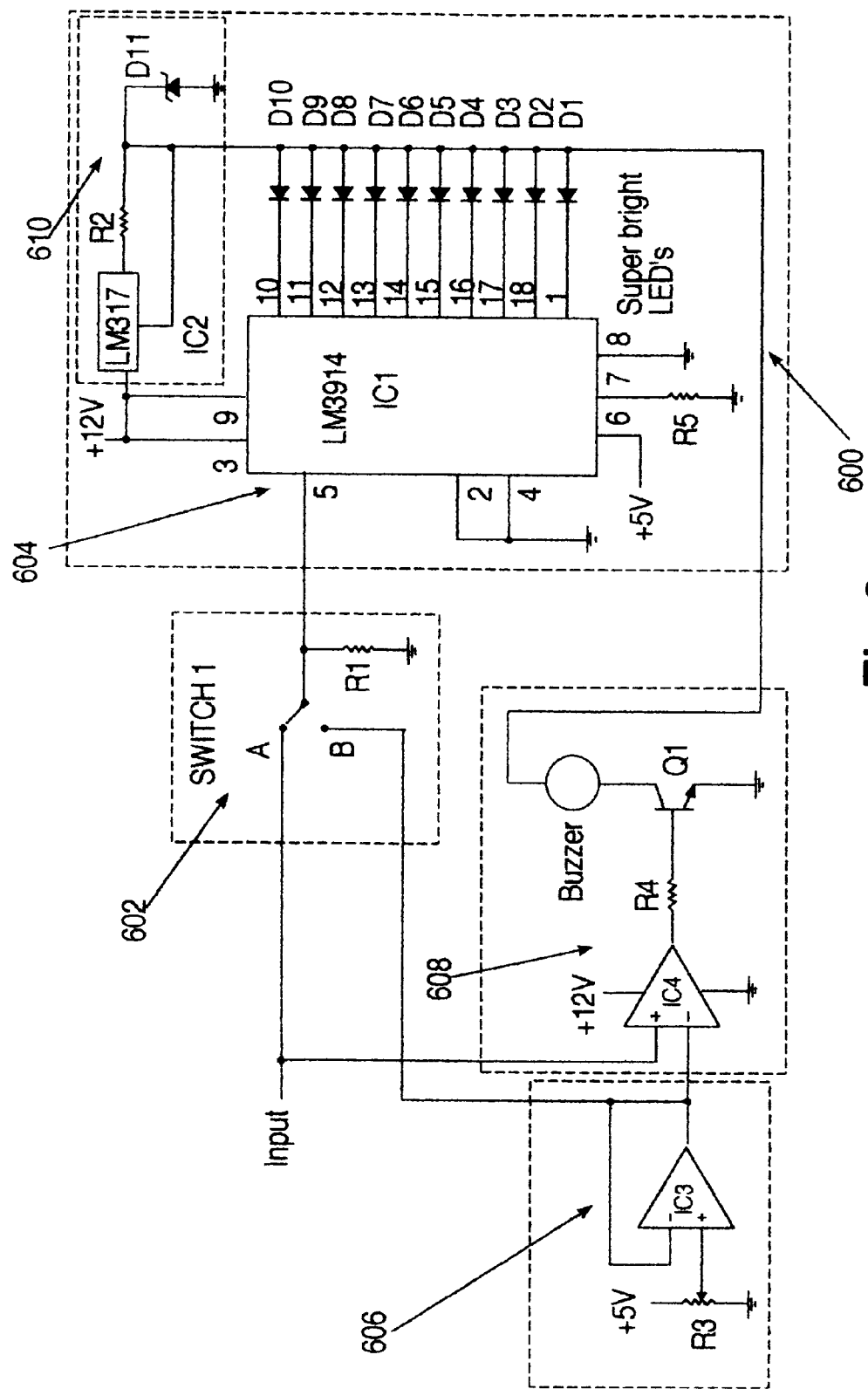
FIG. 9 is a schematic of a display board in the magnetic anomaly detector.

FIG. 9 illustrates the components of display 600. The display 600 serve two functions. First, it converts the voltage from the main amplifier 500 to a bar graph for driving the LED's. Second, it provides an adjusting means for the operator to set how many LED's should be on before the buzzer in the system will sound.

Switch assembly 602 contains a single pole double throw switch and a pull down resistor. The purpose of the switch assembly 602 is to connect a bar graph display stage 604 either connect to an adjustable reference amplifier 606 an input signal. The adjustable reference amplifier 606 contains operational amplifier IC3 and potentiometer R3. The operational amplifier IC3 is connected as a unity gain buffer to buffer the reference voltage coming from the potentiometer R3. Normally, 5 volts is used as a reference, but any voltage lower than the 12 volt positive supply voltage can be used as a reference in this part of the circuit. The output voltage of the reference amplifier 606 is controlled by potentiometer R3.

Voltage comparator and driver stage 608 contains voltage comparator IC4 , resistor R4 , transistor Q1 and an audio buzzer 609. The voltage comparator IC4 is used to compare the input voltage from the main amplifier 500 with the reference voltage from the adjustable reference amplifier 606. If the input voltage of the display 600 is lower than the reference voltage from the adjustable reference amplifier 606, the output of voltage comparator IC4 will be low, transistor Q1 will be off, keeping the buzzer 609 mute. If the input voltage of the display 600 is higher than the reference voltage, the output of voltage comparator IC4 will be high. Current will then flow through the current limiting resistor R4, turning on the transistor Q1 thus turning on the buzzer 609. The buzzer 609 emits a sound to attract the operator's attention, notifying him or her of the presence of a weapon or other ferrous metal object passing near the sensor 100.

Bar graph display stage 604 in this example contains resistor R5, bar graph driver IC1 and ten LED's; any number of LED's can be used, however. Bar graph display stage 604 converts an input voltage from main amplifier 500 to a corresponding number of lit LED's so that the voltage level can be displayed visually. If 5 volts is used as the reference voltage, then any input voltage higher than 5 volts will turn on all ten LED's in the bar graph display. Bar graph display IC1 in this circuit can be either linear or exponential. Resistor R5 in this circuit is used to set the brightness of all ten LED's.

Constant current supply 610 contains an adjustable voltage regulator IC2, resistor R2, and Zener diode D11. The constant current supply 610 is used to stabilize the display 600 because without the constant current supply 610, changes in the supply current created by operating the buzzer 609 and varying the number of lit LED's will itself generate a changing magnetic field detectable by the sensors 100. This changing magnetic field will then be fed back to the sensors 100 and cause the whole system to oscillate. By connecting IC2 and R2 in a constant current supply configuration 610 and using Zener diode D11 to absorb the excess current not being used by the LED's D1–D10 and the buzzer 609, the display circuit 600 will draw a constant amount of current regardless of the number of LED's or the buzzer's on/off condition. During normal operating conditions, switch SW1 will be in position A and connect the bar graph display 604 to the input signal. However, if the operator wishes to adjust the buzzer sensitivity, the switch SW1 is switched to position B, and the bar graph display 604 will read the reference voltage from reference amplifier 606 as an input signal. For example, when the switch is in position B, the operator may adjust potentiometer R3. When the switch is returned to position A, the buzzer will turn on whenever there are more than six LED's lit and give the operator an audible warning. Whenever there are less than six LED's lit, then the buzzer will remain off.

The embodiment described above uses only two channels, but any number of channels may be used to construct the system. One possible configuration places one sensor and its corresponding amplifier, the main amplifier, and the display in one box, and a second sensor and its corresponding amplifier in a second box. However, different configurations can be used to build this magnetic anomaly detector.

Figure 5:
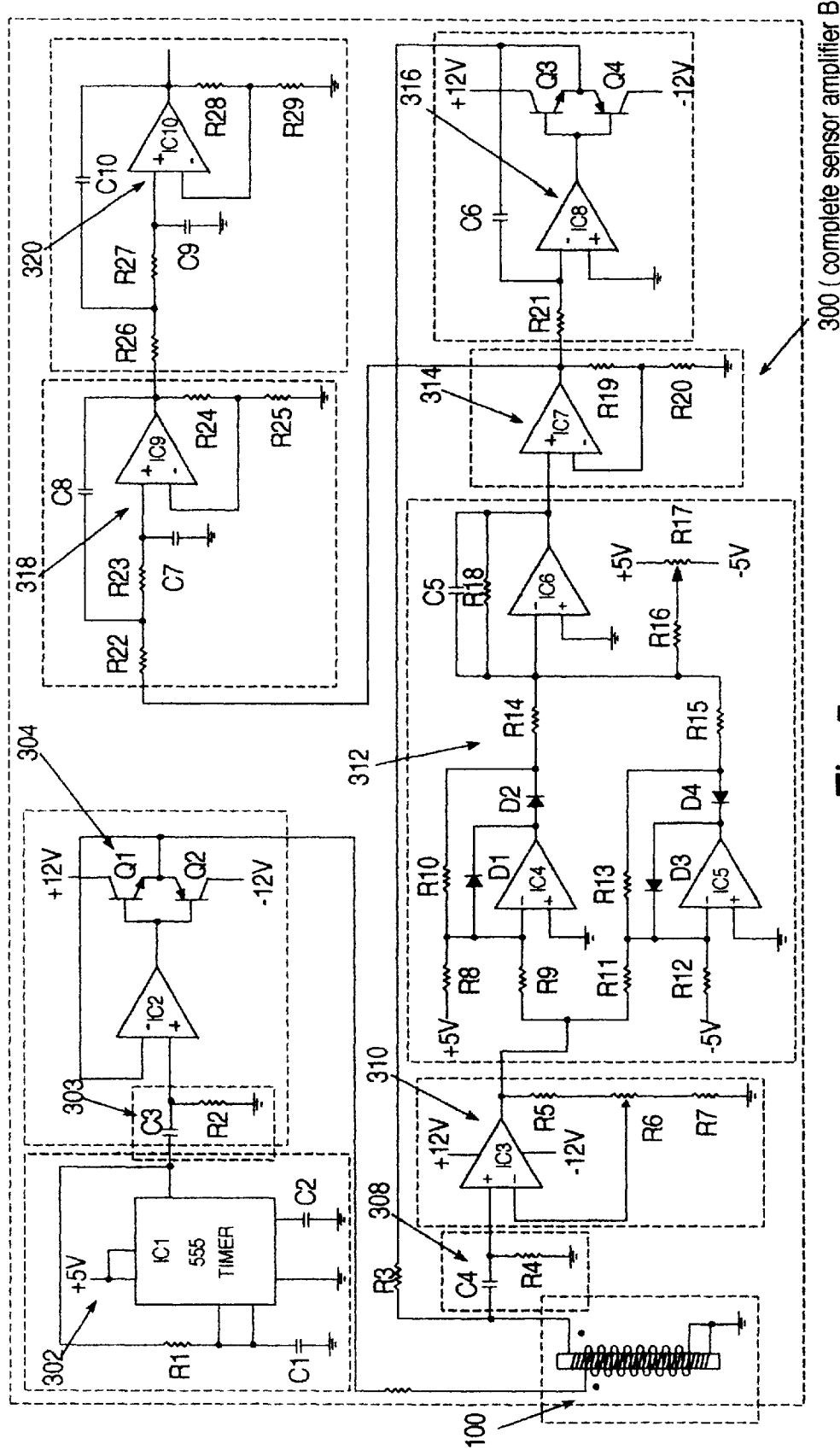
FIG. 5 is a schematic of an alternative sensor amplifier in the magnetic anomaly detector.

Other circuits can be used to perform the same function of sensor amplifier 200. FIGS. 5, 6 and 7 show alternative embodiments for the sensor amplifier construction. For these alternative embodiments, the rest of the system is the same as described above.

Referring to FIGS. 5 and 6, alternative sensor amplifier 300 converts a minute change in magnetic flux disturbance caused by the movement of ferromagnetic metal near the sensor 100 into a large change of voltage at the output of the sensor amplifier 300. A square oscillator 302 contains a 555 timer IC1, resistor R1, and capacitor C1 connected together to generate a near 50% duty cycle square wave. The output amplitude of the oscillator 302 for this example is 0 to 5 volts.

DC de-coupling stage 303 contains a blocking capacitor C3 and resistor R2. The DC decoupling stage 303 is used to block out the DC voltage in the output of the oscillator 302 and prevent it from reaching the next amplifier stage. The output of the DC de-coupling stage 303 in this example is a square wave having a magnitude from −2.5 V to +2.5 V.

Driver stage 304 contains an operational amplifier IC2 and a pair of complementary transistors Q1 and Q2. The driver stage 304 is connected as a unity gain buffer is used to provide the current needed to drive the sensor 100. A resistor 322 is used to limit the current in sensor 100.

Adjustable gain amplifier 310 contains operational amplifier IC3, resistors R4, R5, R7, potentiometer R6, and capacitor C4. The adjustable gain amplifier 310 is used to amplify the output of the sensor 100. Capacitor C4 and resistor R4 separate the AC signal from the DC feedback that shared the same winding of sensor 100. Operational amplifier IC3 in the adjustable gain amplifier 310, along with resistors R5, R7 and potentiometer R6, is connected as a non-inverting amplifier with gain adjustment capability.

Selective integrator 312 contains diodes D1 through D4, resistors R8 through R16 and R18, operational amplifiers IC4, IC5, IC6, capacitor C5, and potentiometer R17. The operation of the selective integrator 312 can be best explained by referring to FIGS. 6A through 6D, which show the response of the selective integrator 312 under different input conditions.

For this example, it is assumed that the reference voltages are +5 V and −5 V. Also, it is assumed that resistors R8, R9, R11, R12, R14, and R15 are all 10K resistors and resistors R10 and R13 are 100K resistors, resistor R18 is 3.3 meg., and capacitor C5 is 0.022 mF. The resistor R16 and potentiometer R17 are omitted in FIGS. 6A through 6D for clarity because they are used in this embodiment only to cancel the offset of the operational amplifiers.

Figure 6A:
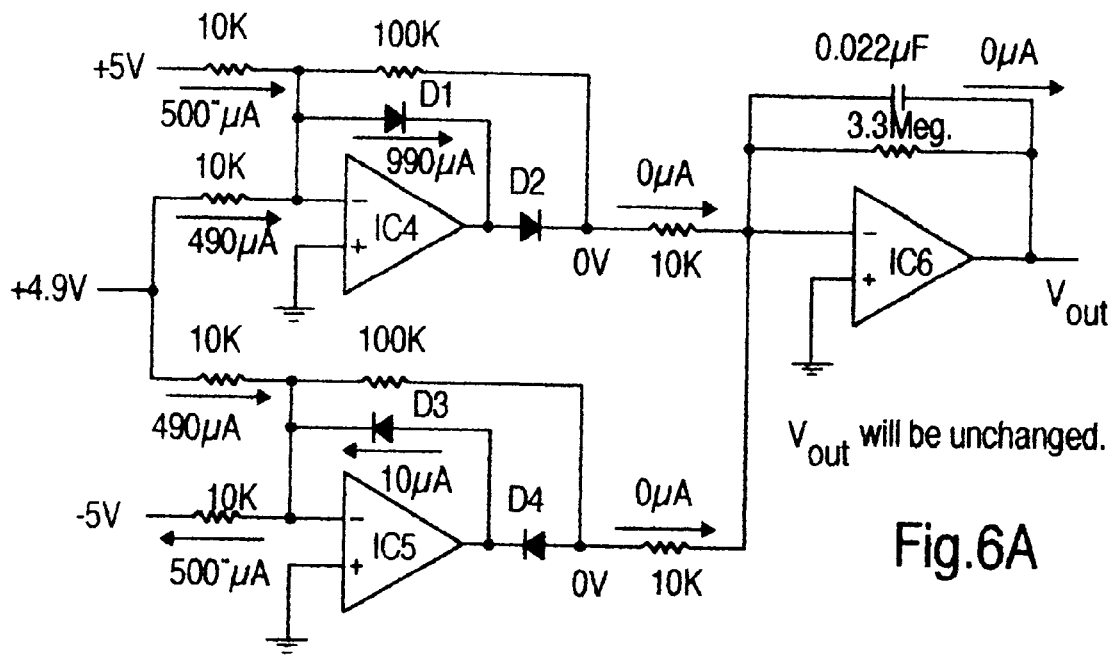
FIGS. 6A through 6D are diagrams showing the operation of a selective integrator in the alternative sensor amplifier shown in FIG. 5.
Figure 7:
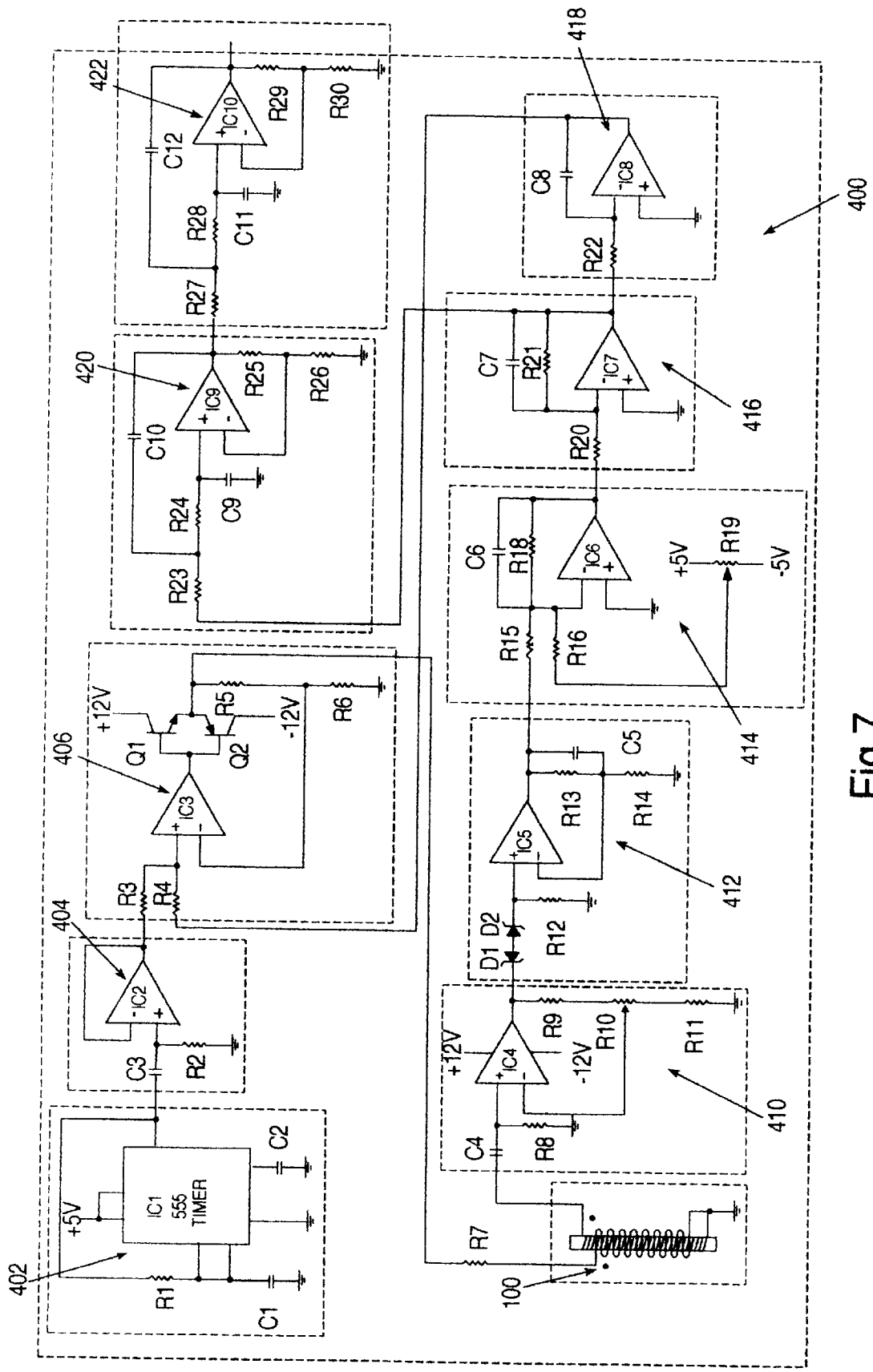
FIG. 7 is a schematic of yet another alternative sensor amplifier in the magnetic anomaly detector.

Referring to FIG. 6A, the input voltage here is 4.9 V, which is lower than +5 V and higher than −5 V, and all the resulting currents and some voltages are as shown in the schematic. As can be seen in FIG. 6A, the loops having operational amplifiers IC4 and IC5 are closed through diodes D1 and D3, and the output of this stage will stay whatever it was before it received the 4.9 V input voltage because there is no charge current through the 0.022 mF capacitor.

Figure 6B:
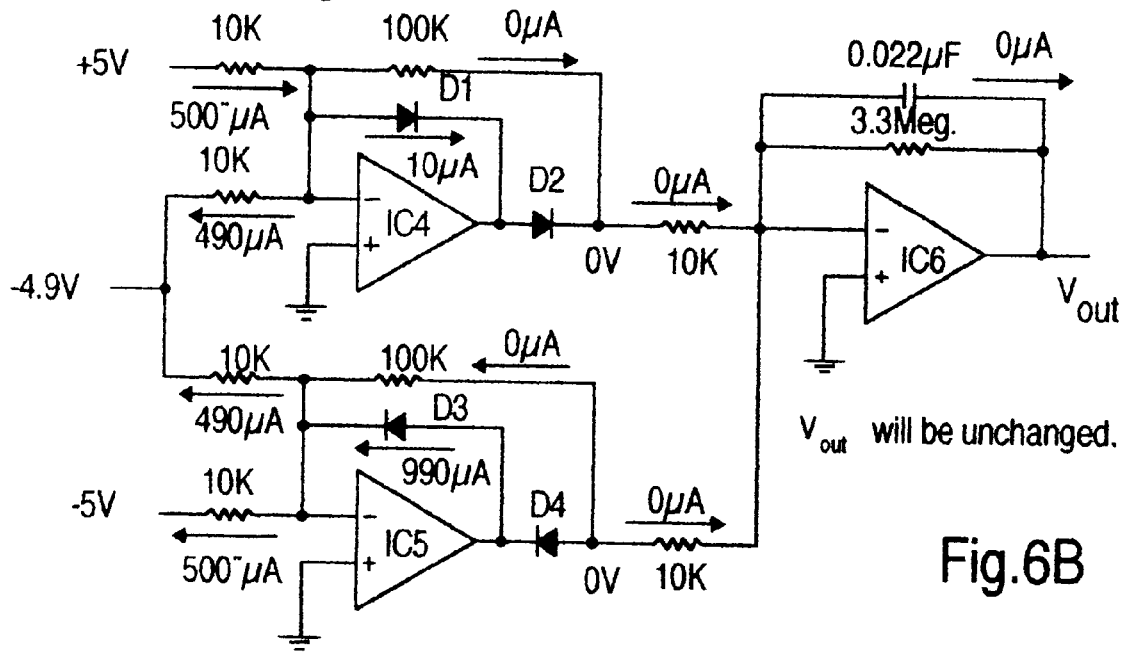

Referring now to FIG. 6B, the input voltage in this case is −4.9 V, which is still lower than +5 V and higher than −5 V, and all the currents and some voltages are as shown in the schematic. Here, the loops having operational amplifiers IC4 and IC5 are closed through diodes D1 and D3, and the output of this stage will stay whatever it was before it received the −4.9 V input voltage because, like the example shown in FIG. 6A, there is no charge current through the 0.022 mF capacitor.

Figure 6C:
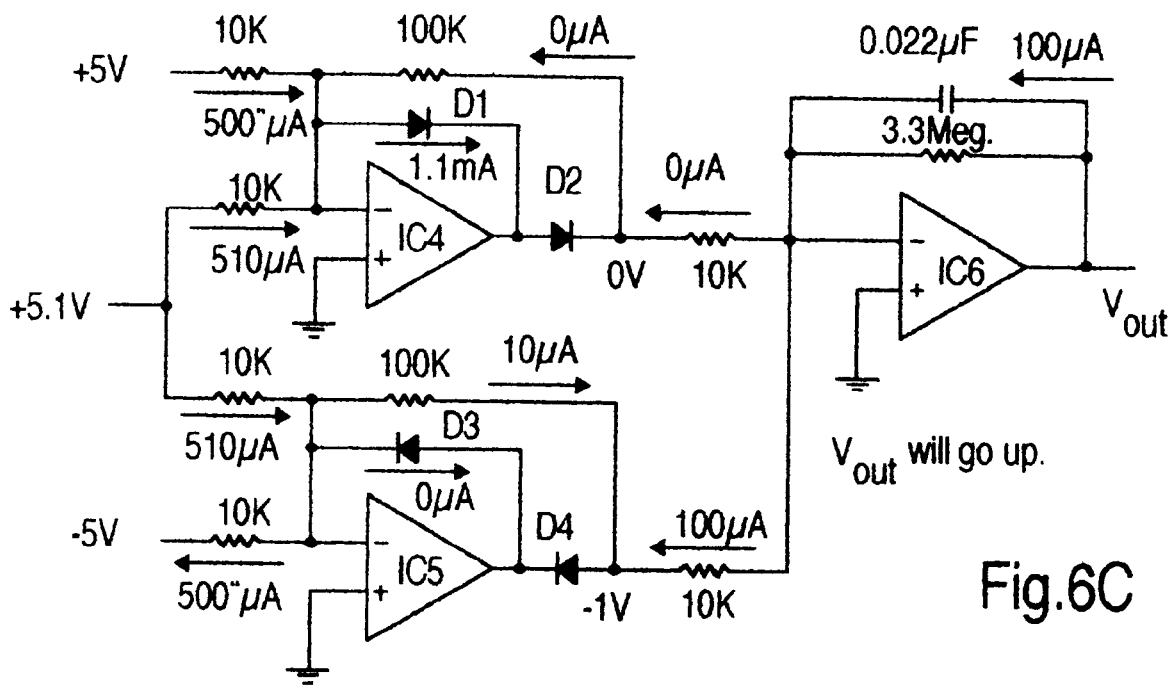

Referring to FIG. 6C, the input voltage here is 5.1 V, which is higher than +5 V and higher than −5 V, and all the resulting currents and some voltages are as shown in the schematic. In this case, the loop having operational amplifier IC4 is closed through diode D1 and the loop having operational amplifier IC5 is closed through the 100K resistor because the diode D3 is reverse biased. As a result, the output of the selective integrator 312 in this case will rise at the rate of 100 mA/0.022 mF or 4550 V/sec.

Figure 6D:
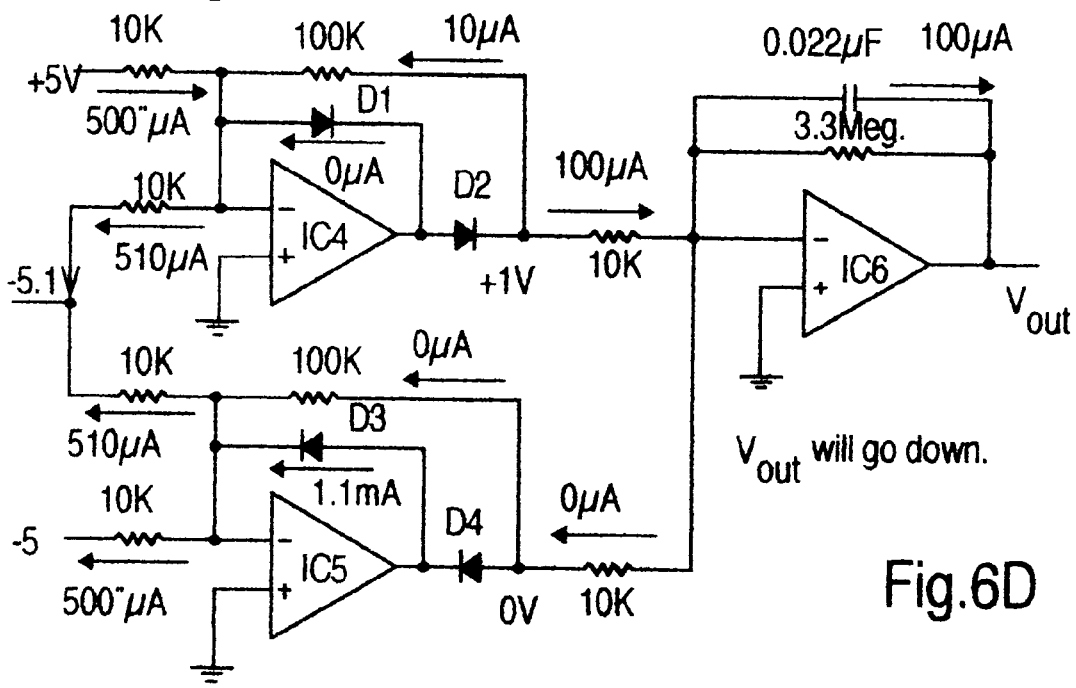

Turning now to FIG. 6D, the input voltage in this example is −5.1 V, which is lower than +5 V and lower than −5 V, and all the resulting currents and some voltages are shown in the schematic. In this case, the loop having operational amplifier IC5 is closed through diode D3 and the loop having operational amplifier IC4 is closed through the 100K resistor because the diode D1 is reverse biased. Thus, the output of the selective integrator 312 in this case will fall at the rate of 100 mA/0.022 mF or 4550 V/sec.

From the above examples, it is clear that only the portion of the input voltage which is higher than the 5 V reference voltage or lower than the −5 V reference voltage will be able to generate a charging or discharging current through the integrating capacitor C6. Referring back to FIG. 5, operational amplifiers IC4 and IC5 and their associated resistors and diodes (resistors R8 through R13 and diodes D1 through D4) select which input signals are allowed to pass through to the integrator (resistors R14, R15 and R18 and capacitor C5). One advantage of using this selective integrator 312 instead of the circuit shown in FIG. 3 is that the selective integrator 312 generates a negative voltage reference from the positive voltage reference, thus making the circuit symmetrical to the ground. This can eliminate all of the mismatches of the Zener diode breakdown voltages. Another advantage of the selective integrator 312 is that the operation of this circuit is virtually independent of the temperature in the environment. Modern three terminal regulators use a band gap reference diode in the integrated circuit, but band gap reference diodes have extremely small temperature constants compared to Zener diodes. By using Zener diodes in a 100% closed loop circuit and a steady reference voltage, the selective integrator 312 can operate without any adverse effects caused by temperature dependency. In addition, even though the selective integrator 312 uses more components that the selective amplifier 212 of the embodiment shown in FIG. 3, the selective integrator 312 will do the selecting, amplifying, and integrating of the input signal all in a single stage.

Non-inverting amplifier stage 314 receives the output from the selective integrator 312 and contains an operational amplifier IC7 and resistors R19, R20. Resistors R19 and R20 are used to set the gain of this non-inverting amplifier.

Next, an integrator 316 with a buffer is used to force the input of the integrator 316 to a DC zero. This integrator 316 contains resistor R21, capacitor C8, operational amplifier IC7 and a pair of complementary transistors Q3 and Q4. Like the previously described embodiment, the time constant of this integrator equals R21*C8 and is intentionally set very long so that the time it takes to force the input of the integrator 316 to a DC zero is longer than the time period over which changes in the input occur, about several hundred milliseconds. The complementary transistor pair Q3 and Q4 is used to provide the current needed for counteracting the earth's magnetic field seen in the high permeability core in the sensor 100. A resistor R3 converts the voltage output of the integrator 316 to a current sufficient to cancel out all the magnetic flux in the core of the sensor 100. If the input to the integrator 316 is positive, the output of the integrator 316 will start going lower and reduce or even change the direction of the current flowing into the secondary coil of sensor 100. This change will force the input of the integrator 316 to approach zero. Similarly, if the input to the integrator 316 is negative, the output of the integrator 316 will start going higher and increase or even change the direction of the current flow into the secondary coil of sensor 100, again forcing the input of the integrator 316 to approach zero. Thus, the long term DC average voltage at the input of the integrator 316 will be zero, but the short term changes at the input will not be zero. These short term changes represent the anomalies in the magnetic field.

Low pass filter 318 contains operational amplifier IC9, resistors R22 through R25, and capacitors C7, C8. The low pass filter 318 is preferably a two pole Sallen-Key equal value low pass filter. In the pass band of the filter 318 of this example, the gain is 4.5 db and in the stop band, the attenuation is -40 db per decade. Since the input of the low pass filter 318 is the same as the input to integrator 316, the long term average input value to the low pass filter 318 is zero, and the short term changes which represent the magnetic anomalies is the signal sought. This filter 318 is used to clean up the signal received from the output of operational amplifier IC7 in non-inverting amplifier 314.

Low pass filter 320 contains operational amplifier IC10, resistors R26 through R29, and capacitors C9, C10. This filter 320 is preferably a two pole Sallen-Key equal value low pass filter. In the pass band of the filter 320 in this example, the gain is 4.5 db and in the stop band, the attenuation is -40 db per decade. In addition, the cutoff frequency of the low pass filter 320 is set to be the same as the low pass filter of the previous stage 318. This low pass filter 320 is used to further clean up the output signal. The output of operational amplifier IC10 in the low pass filter 320 is the output of the sensor amplifier 300.

When there is no ferrous metal moving near the sensor 100, the whole sensor amplifier circuit 300 will reach equilibrium. Any magnetic motive force impressed on the sensor 100 will be cancelled out by a counteracting magnetic motive force generated by the current flow through resistor 306 and the secondary coil of the sensor 100. Thus, the net magnetic flux flowing through the high permeability core in the center of the sensor 100 will be zero. This equilibrium condition will be maintained regardless of the orientation of the sensor axis or the presence of nearby stationary ferrous objects because of the closed loop. However, when a ferrous object is moved quickly near the sensor 100, the change in the magnetic field will cause a momentary change at the output of amplifier 314 until integrator 316 has the time to correct it and bring the circuit back to equilibrium. Like the embodiment shown in FIG. 3, the time lag for correction causes the output of amplifier 314 to "float" momentarily before it is corrected.

For example, assume there is an increase of flux in the core of the sensor 100, resulting in an increase in the positive pulse height and a decrease in the negative pulse height of the pulse train input of the adjustable gain amplifier 310. After amplifier stages 310, 312, 314 and 316, there will be a positive DC voltage with a triangle wave at the output of amplifier 314. This positive DC voltage will force the output of the integrator 316 to go down. This downward movement of the integrator output voltage will reduce the current flow through resistor 306 and the secondary coil of the sensor 100, counteracting the effects of the sudden change and forcing the flux in the core of the sensor 100 to become zero. Because of the long time constant used in the integrator 316, the output of amplifier 314 is allowed momentarily to change freely, or "float". It is this momentary change at the output of amplifier 314 that gives the output signal of the sensor amplifier 300.

Conversely, if there is a decrease of flux in the core of the sensor 100, this change will result in a decrease in the positive pulse height and an increase in the negative pulse height. After amplifier stages 310, 312, 314 and 316, there will be a negative DC voltage with the triangle wave at the output of amplifier 314. This negative DC voltage will force the output of the integrator 316 to go up, increasing the current flow through resistor 306 and the secondary coil of the sensor 100. The increased current flow counteracts the effects of the sudden change and forcing the flux in the core of the sensor 100 to become zero. Because of the long time constant used in the integrator 316, the output of amplifier 314 is allowed momentarily to change freely. Again, this momentary change at the output of amplifier 314 gives the output signal of the sensor amplifier 300. In this embodiment, the freedom of movement of the signal does not depend upon the resistance value of 306 but instead depends upon the time constant R21*C6. With a ground reference signal, amplification and filtering becomes much easier.

Arguably, the output of integrator 316 with an AC coupled output and a very small time constant could also be used as an output representing the magnetic anomaly. However, in order to increase the sensitivity of the device, the resistance R3 needs to be high, and at large ambient magnetic motive forces, the output of the integrator may simply run out of room to change. Using the momentary change at the output of amplifier 314 overcomes this problem.

FIG. 7 illustrates yet another alternative sensor amplifier 400 for use in the magnetic anomaly detector of the invention.

The sensor amplifier 400 shown in FIG. 7 is very similar to sensor amplifier 200 except that the feedback of the DC current is to the primary coil of the sensor 100 and not the secondary coil. The feedback signal for cancelling out the change in the magnetic flux in the core of the sensor 100 is in the form of a voltage to a non-inverting summing amplifier that adds a DC component to the drive signal. This DC component in the drive signal forces a DC current into the primary coil of the sensor 100 to balance out the existing DC magnetic field.

Like the previously described sensor amplifiers 200 and 300, alternative sensor amplifier 400 converts minute changes in magnetic flux disturbance caused by the movement of ferromagnetic metal near the sensor 100 into a large change of voltage at the output of the sensor amplifier 400. A square oscillator 402 contains a 555 timer IC1, resistor R1 and capacitor C1 connected together to generate a near 50% duty cycle square wave.

DC de-coupling stage 404 contains of a blocking capacitor C3 and resistor R2. The DC de-coupling stage 404 is used to block out the DC voltage in the input waveform and prevent it from reaching the next amplifier stage. The output of DC decoupling stage 404 in this example is a square wave that having a magnitude between −2.5 V to +2.5 V.

A driver stage 406 contains an operational amplifier IC3, resistors R3 through R6, and a pair of complementary transistors Q1 and Q2. The driver stage 406 is connected as a summing amplifier and buffer and is used to sum the square wave and the feedback signal and send the summed signal through a current amplifier created by transistors Q1 and Q2 to drive the sensor 100. A resistor 408 is used to limit the current in sensor 100.

Adjustable gain amplifier 410 contains operational amplifier IC4, resistors R8, R9, R11, potentiometer R10, and capacitor C4. Adjustable gain amplifier 410 is used to amplify the output of the sensor 100. Capacitor C4 and resistor R8 are used for AC coupling the signal output from the sensor 100. Operational amplifier IC4 in the adjustable gain amplifier 410, along with resistors R9, R11 and potentiometer R10, is connected as a non-inverting amplifier with gain adjustment capability.

Selective amplifier 412 contains Zener diodes ZD1, ZD2, resistors R12 through R14, operational amplifier IC5, and capacitor C5 which perform the function of amplifying only the parts of the pulse train that are either larger than Vr or smaller then −Vr; in other words, the extreme tips of the pulse train. Note that Vr is the sum of the breakdown voltage plus the forward drop of the Zener diode ZD1 and ZD2. For example, if the Zener diodes used in the selective amplifier 412 have a breakdown voltage of 5.1 V and a forward drop at low current levels of approximately 0.3 V, then the selective amplifier 412 will only amplify the part of the pulse train which is larger than 5.4 V or lower than −5.4 V. For pulse values within the −5.4/5.4 V range, the output of the selective amplifier 412 simply stays at zero level. Resistors R13 and R14 are used to set the gain of the non-inverting amplifier in the selective amplifier 412 and capacitor C5 is used to provide low pass filtering and a pulse stretching function.

The next stage is an inverting summing amplifier 414. The inverting summing amplifier 414 contains operational amplifier IC6, resistors R15, R16, R18, capacitor C6 and potentiometer R19. The inverting summing amplifier 414 provides additional gain and filtering to the system. Potentiometer R19 and resistor R16 also compensate for the mismatch of the breakdown voltages between the two Zener diodes ZD1 and ZD2 and zeroes out all of the offset voltages in the operational amplifiers in the system. Because of the filtering effect of the waveform by capacitor C6, the output of the inverting summing amplifier 414 will become a square wave instead of a pulse train.

An additional inverting amplifier and filter 416 is used to provide additional gain and phase inversion to the system. This amplifier stage 416 contains operational amplifier IC7, resistors R20, R21 and capacitor C7. Because of the capacitor C7, the output of the inverting amplifier 416 will be a triangle wave instead of a square wave.

An integrator with buffer 418 is used to force the input of the integrator 418 to a DC zero. This integrator 418 contains resistor R22, capacitor C8, and operational amplifier IC8. The time constant of the integrator 418 equals R22*C8 and, like the previously described embodiments, is intentionally set very long so that the time it takes to force the input of the integrator 418 to a DC zero is longer than the time period over which changes in the input occur, about several hundred milliseconds. The output of integrator stage 418 is fed back through resistor R4 to create a DC offset needed to cancel out all of the magnetic flux in the core of the sensor 100. Note that the method used in this circuit is different that the one used in sensor amplifier 200. Instead of sending a DC current to the secondary coil of the sensor, the present embodiment forces a DC current through the primary coil of the sensor 100, and the sensor amplifier 400 drives a DC current through the secondary coil of the sensor 100. If the input to the integrator 418 is positive, the output of the integrator 418 will start going lower and reduce or even change the direction of the DC current flowing into the primary core of the sensor 100. This change will force the input of the integrator 418 to approach zero. If the input to the integrator 418 is negative, the output of this integrator will start going higher and increase or even change the direction of the current flow into the primary coil of the sensor 100. This change will also force the input of the integrator 418 to approach zero. Thus, the long term DC average voltage at the input of the integrator 418 will be zero, but the short term changes at the input will not be zero. These short term changes represent the anomalies in the magnetic field.

Low pass filter 420 contains operational amplifier IC9, resistors R23 through R26, and capacitors C9, C10. The low pass filter 420 is preferably a two pole Sallen-Key equal value low pass filter. In the pass band of the filter 420 in this example, the gain is 4.5 db and in the stop band, the attenuation is −40 db per decade. Like the previously described embodiments, the long term average input value of the low pass filter 420 is zero, and the short term changes is the signal sought. This filter is used to clean up the signal received from the operational amplifier IC7 in inverting amplifier 414.

Low pass filter 422 contains operational amplifier IC10, resistors R27 through R30, and capacitors C11, C12. This filter 422 is preferably a two pole Sallen-Key equal value low pass filter. Like low pass filter 420, in the pass band of this filter 422, the gain is 4.5 db and in the stop band, the attenuation is −40 db per decade. In other words, the cutoff frequency of the filter 422 is set to be the same as the low pass filter in the previous stage 420. The present low pass filter 422 is used to further clean up the output signal. The output of operational amplifier IC10 serves as the output of the sensor amplifier 400. As in the previous embodiments, the output will change when a ferrous metal object moves near the sensor 100, and the output signal is also fed to the main amplifier 500 for further signal processing and display.

While the preferred manner for carrying out the invention has been described in detail, those of ordinary skill in the art will recognize various alternative designs and embodiments for practicing the invention without departing from the spirit of the invention as defined by the appended claims.

What is claimed is:

1. An apparatus for detecting anomalies in a magnetic field, comprising:

means for generating a square wave;

a sensor driven by said square wave generator for sensing changes in the magnetic field of said sensor, said sensor outputting a first pulse train having an equilibrium value in the absence of anomalies in the magnetic field and a pulse height which changes in response to anomalies in the magnetic field;

a sensor amplifier connected to the sensor for receiving the first pulse train from said sensor and for amplifying changes in the first pulse train, said sensor amplifier outputting a feedback signal to said sensor; said feedback signal representing the difference between the equilibrium value and the changes in the pulse height due to the anomaly in the magnetic field; said sensor amplifier correcting the first pulse train to the equilibrium value;

a main amplifier connected to the sensor amplifier for amplifying a filtered waveform output of the sensor amplifier; and a display responsive to the main amplifier.

2. The magnetic anomaly detector of claim 1, wherein the sensor amplifier comprises:

a DC decoupling stage for blocking out the DC voltage in the square wave generated by the generating means and outputting a decoupled square wave;

a driver stage for receiving the decoupled square wave and for providing a driving current to the sensor;

a selective amplifier for amplifying portions of the first pulse train which are greater than a first threshold value or less than a second threshold value, said first threshold value being larger than said second threshold value, said selective amplifier outputting a second pulse train reflecting the portions of said first pulse train which are outside of said first and second threshold values;

means for converting said second pulse train into an output waveform whose DC value changes when a magnetic anomaly is detected;

an integrator for forcing the average value of the output waveform of said converting means to zero over a predetermined time period, wherein the value at the input of the integrator represents the magnetic anomaly, said output of said integrator being sent to said sensor to compensate for changes in the sensor due to the magnetic anomaly, and wherein the predetermined time period is set longer than a time over which short term changes occur in the average value of the output waveform of said converting means;

at least one low-pass filter for receiving said waveform from said converting means and outputting a filtered waveform to said main amplifier.

3. The magnetic anomaly detector of claim 2, wherein said selective amplifier, said converting means, and said integrator are combined into one stage.

4. The magnetic anomaly detector of claim 2, wherein the output of said integrator is connected to a secondary coil of said sensor for driving the secondary coil.

5. The magnetic anomaly detector of claim 2, wherein the output of said integrator is connected to a primary coil of said sensor for driving the primary coil.

6. The magnetic anomaly detector of claim 2, wherein said converting means comprises a first and second inverting amplifier for inverting the phase of the second pulse train and converting it into an output waveform.

7. The magnetic anomaly detector of claim 1, wherein said main amplifier comprises:

an adjustable gain amplifier for receiving a signal from a selective amplifier and blocking out the DC voltage signal of the signal such that only the AC portion of the signal passes through;

an inverting amplifier which receives the AC portion of the signal;

a precision diode stage which outputs a response signal when the output from the sensor amplifier indicates a change in the magnetic field; and a peak detector for holding the peak value of the response signal.

8. The magnetic anomaly detector of claim 7, wherein the main amplifier further comprises an adjustable reference acting in conjunction with a summing amplifier for eliminating noise caused by the earth's magnetic field and sensed by the sensor.

9. The magnetic anomaly detector of claim 1, wherein the display comprises:

a reference amplifier for setting a first reference voltage;

a lighting means having a plurality of lights responsive to said response signal wherein the number of lights activated is proportional to a ratio of the response signal and the first reference voltage; and a sounding means responsive to said response signal wherein said sounding means is activated when said response signal exceeds a second reference voltage.

10. The magnetic anomaly detector of claim 9, wherein said first reference voltage is adjustable.

11. The magnetic anomaly detector of claim 9, wherein said display further comprises means for converting said response signal from said main amplifier into a bar graph display, and wherein said lighting means comprises a bar graph driver and a plurality of LED's responsive to the bar graph driver.

12. The magnetic anomaly detector of claim 9, wherein said display further comprises:

a constant current source; and means for absorbing current from the constant current source which is not used by said lighting means and said sounding means to prevent changes in the magnetic field caused by the operation of said lighting means and said sounding means.

13. An apparatus for detecting anomalies in a magnetic field, comprising:

means for generating a square wave;

a sensor having a core, a primary winding, and a secondary winding, said sensor being driven by said square wave generator for sensing changes in the magnetic field of said sensor and outputting a first pulse train having a equilibrium value in the absence of anomalies in the magnetic field and a pulse height which changes in response to anomalies in the magnetic field;

a sensor amplifier connected to the sensor for receiving the first pulse train from said sensor and for amplifying changes in the first pulse train, said sensor amplifier having:

a DC decoupling stage for blocking out the DC voltage in the square wave generated by the generating means and outputting a decoupled square wave;

a driver stage for receiving the decoupled square wave and for providing a driving current to the sensor;

a selective amplifier for amplifying portions of the first pulse train which are greater than a first threshold value or less than a second threshold value, said first threshold value being larger than said second threshold value, said selective amplifier outputting a second pulse train reflecting the portions of said first pulse train which are outside of said first and second threshold values;

a first and second inverting amplifier for inverting the phase of the output of said second pulse train and converting it into an output waveform;

an integrator for forcing the DC value of the output waveform of said second inverting amplifier to zero over a predetermined time period, wherein the value at the input of the integrator represents the magnetic anomaly, said output of said integrator being sent to one of said primary and secondary coils of said sensor to compensate for changes in the sensor due to the magnetic anomaly, and wherein the predetermined time period is set longer than a time period over which short term changes occur in the average value of the output waveform of said converting means; and at least one low-pass filter for receiving said waveform from said converting means and outputting a filtered waveform to a main amplifier;

said main amplifier connected to the sensor amplifier for amplifying the filtered waveform output by the sensor amplifier, said main amplifier having:

an adjustable gain amplifier for receiving a signal from said selective amplifier and blocking out the DC voltage signal of the signal such that only the AC portion of the signal passes through;

an inverting amplifier which receives the AC portion of the signal;

a precision diode stage which outputs a response signal when the output from the sensor amplifier indicates a change in the magnetic field;

an adjustable reference acting in conjunction with a summing amplifier;

a peak detector for holding the peak value of the response signal; and a display responsive to the main amplifier.

14. The magnetic anomaly detector of claim 13, wherein the display comprises:

a reference amplifier for setting a first reference voltage;

a lighting means having a plurality of lights responsive to said response signal wherein the number of lights activated is proportional to a ratio of the response signal and the first reference voltage; and a sounding means responsive to said response signal wherein the sounding means is activated when said response signal exceeds a second reference voltage.

15. The magnetic anomaly detector of claim 14, wherein said display further comprises means for converting said response signal from said main amplifier into a bar graph display, and wherein said lighting means comprises a bar graph driver and a plurality of LED's responsive to the bar graph driver.

16. The magnetic anomaly detector of claim 14, wherein said display further comprises:

a constant current source; and means for absorbing current from the constant current source which is not used by said lighting means and said sounding means to prevent changes in the magnetic field caused by the operation of said lighting means and said sounding means.

* * * * *